US012743747B2

(12) United States Patent
Dutson et al.

(10) Patent No.: US 12,743,747 B2
(45) Date of Patent: Sep. 22, 2026

(54) SYSTEMS, METHODS, AND MEDIA FOR GENERATING DIGITAL IMAGES USING LOW BIT DEPTH IMAGE SENSOR DATA

(71) Applicant: WISCONSIN ALUMNI RESEARCH FOUNDATION, Madison, WI (US)

(72) Inventors: Matthew Dutson, Madison, WI (US); Mohit Gupta, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 18/886,151

(22) Filed: Sep. 16, 2024

(65) Prior Publication Data

US 2025/0259270 A1 Aug. 14, 2025

Related U.S. Application Data

(63) Continuation of application No. 17/687,390, filed on Mar. 4, 2022, now Pat. No. 12,094,087.

(51) Int. Cl.
*G06T 5/50* (2006.01)
*G06T 5/70* (2024.01)
(Continued)

(52) U.S. Cl.
CPC .................. *G06T 5/50* (2013.01); *G06T 5/70* (2024.01); *H04N 9/646* (2013.01);
(Continued)

(58) Field of Classification Search
CPC ... G06T 5/50; G06T 5/70; G06T 2207/10016; G06T 2207/10024; G06T 2207/20081; G06T 2207/20084; H04N 9/646; H10F 30/225; H10F 39/18; G06V 10/147; G06V 10/454; G06V 10/82
See application file for complete search history.

(56) References Cited

U.S. PATENT DOCUMENTS 11,582,431 B1 * 2/2023 Khemka .............. H04N 19/182
12,287,385 B2 * 4/2025 Wang ................. G01R 33/4828
(Continued)

OTHER PUBLICATIONS

Chandramouli et al.,"A Bit Too Much? High Speed Imaging from Sparse Photon Counts," arXiv: 1811.02396v3 [cs.CV] May 11, 2019.

(Continued)

*Primary Examiner* — Mekonnen D Dagnew
(74) *Attorney, Agent, or Firm* — Andrus Intellectual Property Law, LLP

(57) ABSTRACT

In accordance with some embodiments, systems, methods, and media for generating digital images using low bit depth image sensor data are provided. In some embodiments, the system comprises: an image sensor; a processor programmed to: receive, from the image sensor, a series of low bit depth frames; provide low bit depth image information to a trained machine learning model comprising: a 3D convolutional layer; a 2D convolutional LSTM layer; a concatenation layer configured to generate a tensor that includes an output of the 2D convolutional LSTM layer and the low bit depth image information; and a 2D convolutional layer configured to generate an output based on the tensor; and generate a high bit depth image of a scene based on an output of the two-dimensional convolutional layer.

20 Claims, 11 Drawing Sheets

(51) Int. Cl.
*H04N 9/64* (2023.01)
*H10F 30/225* (2025.01)
*H10F 39/18* (2025.01)

(52) U.S. Cl.
CPC ............... *G06T 2207/10016* (2013.01); *G06T 2207/10024* (2013.01); *G06T 2207/20081* (2013.01); *G06T 2207/20084* (2013.01); *H10F 30/225* (2025.01); *H10F 39/18* (2025.01)

(56) References Cited

U.S. PATENT DOCUMENTS

2012/0206470 A1* 8/2012 Frank ........................ G06T 5/92
345/581
2016/0021391 A1* 1/2016 Su ........................ H04N 19/136
375/240.12
2021/0290191 A1* 9/2021 Qi .......................... A61B 6/032

OTHER PUBLICATIONS

Choi et al., "Image Reconstruction for Quanta Image Sensores Using Deep Neural Networks," (2018) IEEE.
Lotter et al., "Deep Predictive Coding Networks for Video Prediction and Unsupervised Learning", Published as a conference paper at ICLR 2017, arXiv:1605.08104v5 [cs.LG] Mar. 1, 2017.
Ma et al., "Quanta Burst Phtography", ACM Trans. Graph., vol. 39, No. 4, Article 79. Publication date: Jul. 2020.
Villegas et al., "Decomposing Motion and Content for Natural Video Sequence Prediction", Published as a conference paper at ICLR 2017, arXiv:1706.08033v2 [cs.CV] Jan. 8, 2018.
Yuki Endo et al., "Deep reverse tone mapping", ACM Transactions on Graphics, vol. 36, No. 6, Nov. 20, 2017, pp. 1-10.
Xia Zhihao et al., "Basis Prediction Networks for Effective Burst Denoising With Larger Kernels", 2020 IEEE/CVF Conference on Computer Vision and Pattern Recognition, Jun. 13, 2020, pp. 11841-11850.
Gers F A et al., Learning to forget: continual prediction with LSTM, Artificial Neural Networks, 1999. ICANN 99. Ninth International Conference on, Sep. 1999, pp. 850-855.
Wieschollek Patrick et al., "Learning Blind Motion Deblurring", 2017 IEEE International Conference on Computer Vision (ICCV), Oct. 22, 2017, pp. 231-240.
Yiheng Chi et al., "Dynamic Low-Light Imaging with Quanta Image Sensors", arxiv.org Cornell University Library, Jul. 16, 2020, entire document.
Extended European Search Report in EP Application No. 23763826.7, mailed Nov. 19, 2025.

* cited by examiner

Recovered Image

Binary Frame

400

Ground Truth

Predicted Image

Quanta Burst Technique

No Object Detected in 8 Frame Average

Object Detected in Predicted Image

Object Detected in Ground Truth

SYSTEMS, METHODS, AND MEDIA FOR GENERATING DIGITAL IMAGES USING LOW BIT DEPTH IMAGE SENSOR DATA

CROSS-REFERENCE TO RELATED APPLICATIONS

This application is a continuation application of U.S. application Ser. No. 17/687,390 filed on Mar. 4, 2022 which application is incorporated by reference herein in its entirety.

STATEMENT REGARDING FEDERALLY SPONSORED RESEARCH

This invention was made with government support under 1943149 awarded by the National Science Foundation. The government has certain rights in the invention.

BACKGROUND

In general, image sensors that are capable of detecting the arrival of individual photons, which can be referred to as quanta image sensors, can generate data that has relatively low read noise, relatively high temporal granularity, and relatively high dynamic range. However, raw binary frames from a quanta image sensor contain high shot noise due to their short duration.

Accordingly, new systems, methods, and media for generating digital images using low bit depth image sensor data are desirable.

SUMMARY

In accordance with some embodiments of the disclosed subject matter, systems, methods, and media for generating digital images using low bit depth image sensor data are provided.

In accordance with some embodiments of the disclosed subject matter, a system for generating digital images is provided, the system comprising: an image sensor configured to generate low bit depth frames; at least one processor that is programmed to: receive, from the image sensor, a series of low bit depth frames; provide low bit depth image information based on the series of low bit depth frames to a trained machine learning model, the trained machine learning model comprising: a three-dimensional convolutional layer; a two-dimensional convolutional long short term memory (LSTM) layer configured to receive an output of the three dimensional convolutional layer; a concatenation layer configured to generate a tensor that includes a concatenation of an output of the 2D convolutional LSTM layer and the low bit depth image information; and a two-dimensional convolutional layer configured to generate an output based on the tensor generated by the concatenation layer; and generate a high bit depth image of the scene based on an output of the two-dimensional convolutional layer.

In some embodiments, the image sensor comprises a plurality of single-photon avalanche diodes.

In some embodiments, the series of low bit depth frames comprises a series of binary frames.

In some embodiments, pixels of the low bit depth frames are represented using no more than 4 bits.

In some embodiments, pixels of the high bit depth image are represented using at least 8 bits.

In some embodiments, the two-dimensional convolutional LSTM layer is a bidirectional two-dimensional convolutional LSTM layer.

In some embodiments, the trained machine learning model further comprises: three LSTM blocks, each comprising: two 3D convolutional layers; a bidirectional 2D convolutional LSTM layer configured to receive an output of the second three-dimensional convolutional layer; and a concatenation layer configured to concatenate an input to the LSTM block and an output of the bidirectional two-dimensional convolutional LSTM layer, wherein the three-dimensional convolution layer, the two-dimensional convolutional LSTM layer, and the concatenation layer are included in the third LSTM block.

In some embodiments, the trained machine learning model comprises a plurality of input channels, each corresponding to a color channel.

In accordance with some embodiments of the disclosed subject matter, a method for generating range digital images is provided, the method comprising: receiving, from an image sensor, a series of low bit depth frames; providing low bit depth image information based on the series of low bit depth frames to a trained machine learning model, the trained machine learning model comprising: a three-dimensional convolutional layer; a two-dimensional convolutional long short term memory (LSTM) layer configured to receive an output of the three dimensional convolutional layer; a concatenation layer configured to generate a tensor that includes a concatenation of an output of the 2D convolutional LSTM layer and the low bit depth image information; and a two-dimensional convolutional layer configured to generate an output based on the tensor generated by the concatenation layer; and generating a high bit depth image of the scene based on an output of the two-dimensional convolutional layer.

In accordance with some embodiments of the disclosed subject matter, a non-transitory computer readable medium containing computer executable instructions that, when executed by a processor, cause the processor to perform a method for generating range digital images is provided, the method comprising: receiving, from an image sensor, a series of low bit depth frames; providing low bit depth image information based on the series of low bit depth frames to a trained machine learning model, the trained machine learning model comprising: a three-dimensional convolutional layer; a two-dimensional convolutional long short term memory (LSTM) layer configured to receive an output of the three dimensional convolutional layer; a concatenation layer configured to generate a tensor that includes a concatenation of an output of the 2D convolutional LSTM layer and the low bit depth image information; and a two-dimensional convolutional layer configured to generate an output based on the tensor generated by the concatenation layer; and generating a high bit depth image of the scene based on an output of the two-dimensional convolutional layer.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

DETAILED DESCRIPTION

Figure 1:
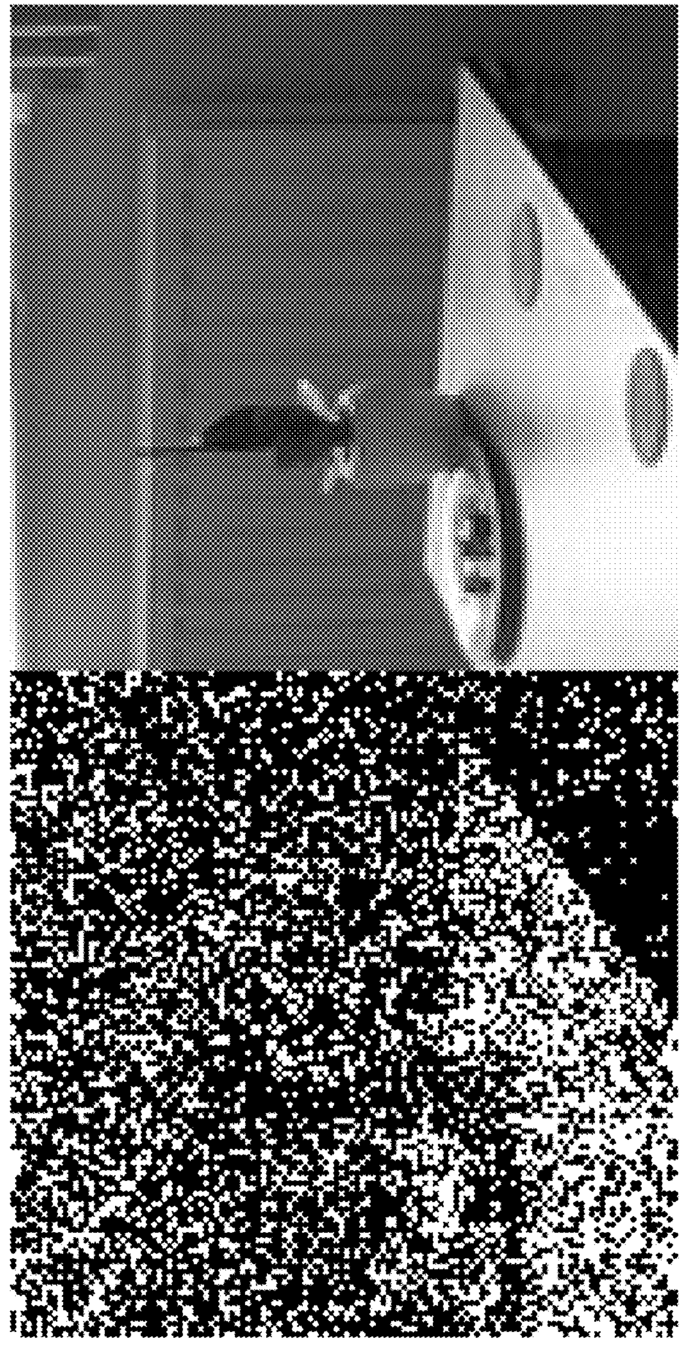
FIG. 1 shows an example of a high noise low bit depth frame of a scene and a low-noise high bit depth frame of the scene that can be generated using the low-bit depth frame in accordance with some embodiments of the disclosed subject matter.

In accordance with various embodiments, mechanisms (which can, for example, include systems, methods, and media) for generating digital images using low bit depth image sensor data are provided.

In some embodiments, mechanisms described herein can be used to generate relatively low noise images with relatively high bit depths (e.g., at least 8 bits per pixel per color channel) using relatively high noise frames with relatively low bit depths (e.g., 1 bit per pixel per color channel, 2 bits per pixel per color channel, 3 bits per pixel per color channel, 4 bits per pixel per color channel, no more than 4 bits per pixel per color channel). In some embodiments, mechanisms described herein can generate high bit depth images at a rate that is comparable to a rate at which frames (or a relatively short series of frames) are output by a quanta image sensor.

For example, single-photon avalanche diodes (SPADs) are a class of single-photon image sensor that can be operated at very high frame rates (e.g., on the order of 100,000 frames per second). Conventional image sensors (e.g., CMOS image sensors, CCD image sensor) generally return an integer value from each pixel that is proportional to brightness of the scene at that pixel. Image sensors that are implemented with SPADs (and/or other QIS technologies) generally return binary values when configured in a frame read out mode. For example, a pixel implemented with a SPAD can output a 1 if at least one photon was detected and can output a 0 otherwise. SPADs offer several benefits over conventional sensors, including low read noise, high temporal granularity, and high dynamic range. However, the raw binary frames from a SPAD (or any quanta image sensor) contain high shot noise due to their short duration.

In some embodiments, mechanisms described herein can be implemented to recover relatively low noise and high bit depth images from low bit depth image data output by a QIS. For example, given a sequence of noisy frames $\{b_0, b_1, \ldots, b_t\}$ that include arbitrary scene and camera motion, mechanisms described herein can attempt to estimate a low-noise frame sequence $$\{\tilde{f}_0, \tilde{f}_1, \ldots, \tilde{f}_t\}$$

that corresponds to a true sequence of frames $\{f_0, f_1, f_t\}$ corresponding to the scene. In some embodiments, mechanisms described herein can leverage the high frame rate of the input to create output with a high frame rate (e.g., an equally high frame rate) while merging the intensity information from multiple frames to reduce noise.

In some embodiments, mechanisms described herein can estimate a frame $$\tilde{f}_i$$

using information from before and after the frame (e.g., from $b \leq i$ and from $b \geq i$, if such future information is available). Additionally or alternatively, in some embodiments, mechanisms described herein can estimate a frame $$\tilde{f}_i$$

in real time or near real time (e.g., an estimate $$\tilde{f}_i$$

soon after $b_i$ arrives, an estimate $$\tilde{f}_i$$

soon before $b_t$ arrives), and can exclude use of any future information, such that mechanisms described herein can $$\hat{f}_i$$

using frames $\{b_0, b_1, \ldots, b_i\}$.

In some embodiments, mechanisms described herein can compensate for motion between high-noise frames (e.g., output from a QIS) using a recurrent convolutional neural network (RCNN). Convolutional neural networks can be used for many computer vision tasks, and are effective for processing spatially localized structures in images. Recurrent neural networks can be used for temporal sequence processing, and are capable of processing and generating sequences of arbitrary length. In some embodiments, mechanisms described herein can utilize an RCNN to process spatially localized structures in a sequence of high noise frames to generate a series of low noise frames.

In some embodiments, mechanisms described herein can utilize one or more convolutional long short-term memory (LSTM) layers to recover relatively low noise and high bit depth images from low bit depth image data output by a QIS. LSTMs can be configured to model long-term dependencies by adaptively updating an internal state. Convolutional LSTMs can replace the dense operations in a regular LSTM with convolutional operations. As described below, a model implemented using one or more bidirectional LSTMs, which allow information flow both backward and forward in time, achieved the highest performance. In order to utilize a bidirectional LSTM, all frames to be analyzed are captured and stored before processing. Alternatively, a model can be implemented using one or more unidirectional LSTMs (which processes frames in the forward temporal direction only). For example, such a model can be implemented for real-time applications, and/or for use with devices with low-memory and/or processing resources.

In some embodiments, mechanisms described herein can be implemented in a variety of different implementations with different computational costs. For example, in applications where resources (e.g., memory and/or computing resource) are limited, the number of layers and the size of each layer can be reduced. In general, a tradeoff space between smaller, more efficient networks and larger, high-fidelity networks can be expected.

In some embodiments, mechanisms described herein can be implemented to ingest new frames in real time, and to output high bit depth predicted frames at a similar rate. For example, after an RNN implemented in accordance with mechanisms described herein uses a new frame to update an internal state, that frame can be discarded (note that this is only the case for unidirectional RNNs). Other techniques (e.g., quanta burst photography) include capturing and storing all frames that are to be used prior to performing the analysis.

In some embodiments, mechanisms described herein can be implemented with high inherent parallelism that facilitate efficient execution on a graphics processing unit (GPU). For example, preliminary results show orders of magnitude lower computation time compared to quanta burst photography.

In some embodiments, mechanisms described herein can be used to implement a model (e.g., a convolutional RNN model) that can be trained end-to-end with one or more downstream neural networks that are configured to perform image processing tasks and/or machine vision tasks. For example, mechanisms described herein can be used to implement a convolutional RNN that can be trained concurrently with a CNN that is configured to perform object detection. Such end-to-end training can facilitate the convolutional RNN and the downstream network can mutually optimize their parameters, facilitating higher quality output with noisier input.

In some embodiments, a convolutional RNN implemented in accordance with mechanisms described herein can learn statistical priors on video structure, which can cause such a convolutional RNN to outperform conventional, non-learned algorithms on videos with extremely high noise.

FIG. 1 shows an example of a high noise low bit depth frame of a scene and a low-noise high bit depth frame of the scene that can be generated using the low-bit depth frame in accordance with some embodiments of the disclosed subject matter. As shown in FIG. 1, a binary frame which may be output by a quanta image sensor is generally very noisy. To obtain a usable non-binary image, the information from multiple consecutive binary frames can be merged. Binary frame merging can be considered a special case of a more general problem: imaging and high-level vision under motion. When a scene contains motion, imaging systems can either reduce the exposure time to reduce the amount of motion captured during the exposure (which leads to noisier images), or increase the exposure time to deal with noise (which leads to blurred images). In either case, the result is a low-quality image. If this low-quality image is then fed to a downstream model (e.g., a machine learning system for object detection), that model will suffer from reduced accuracy.

Figure 2:
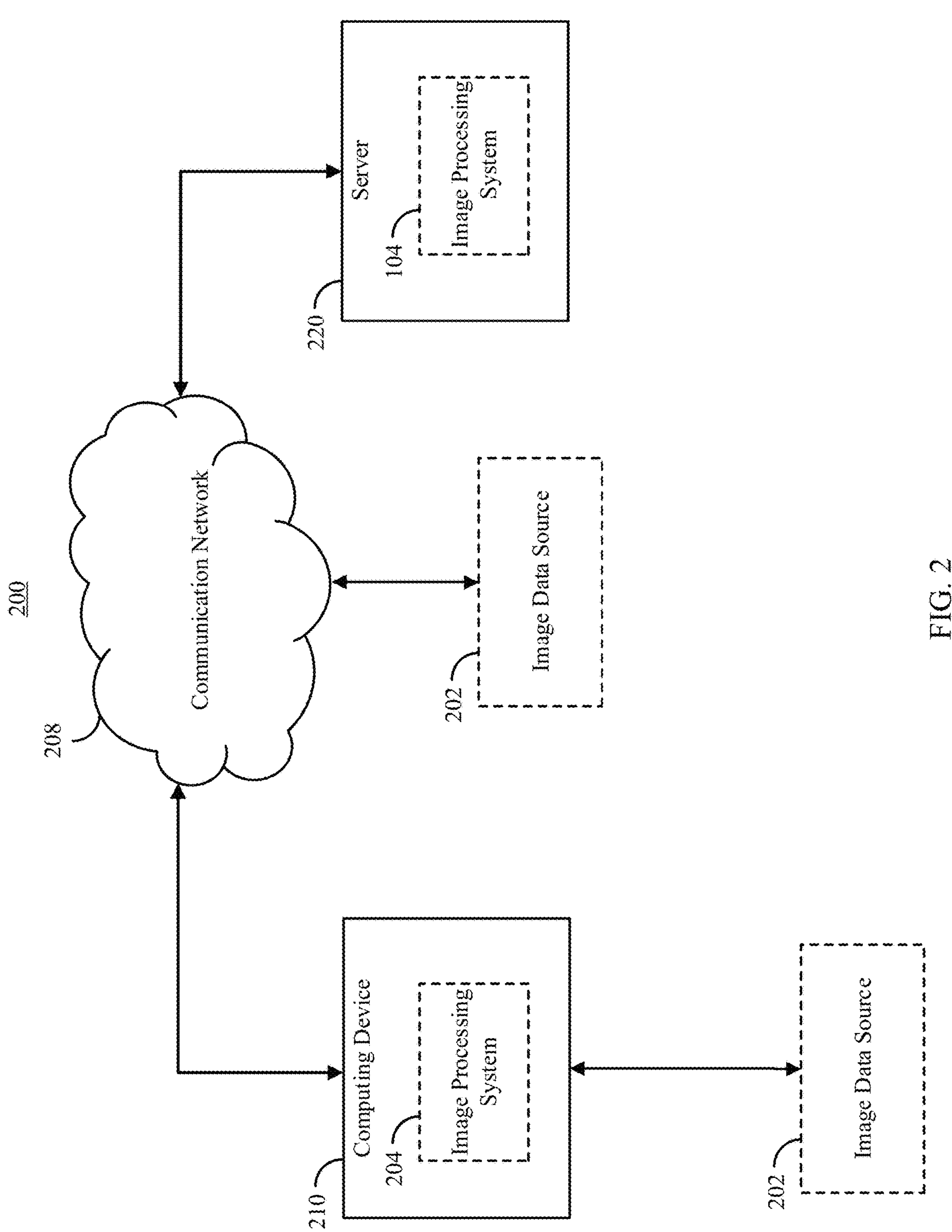
FIG. 2 shows an example of a system for generating digital images using low bit depth image sensor data in accordance with some embodiments of the disclosed subject matter.

FIG. 2 shows an example 200 of a system for generating digital images using low bit depth image sensor data in accordance with some embodiments of the disclosed subject matter. As shown in FIG. 2, a computing device 210 can receive image data from an image data source(s) 202. In some embodiments, computing device 210 can execute at least a portion of an image processing system 204 to perform an image processing task, such as generating a high bit depth image from low bit depth images using a neural network, training a neural network to generate high bit depth image from low bit depth images, etc. Additionally, in some embodiments, computing device 210 can execute at least a portion of a machine vision system (not shown) to perform a machine vision task, such as image classification, object detection, image segmentation, object tracking, and/or any other suitable computer vision task. For example, a machine vision system can receive one or more images (e.g., high bit depth images, etc.) generated by image processing system 204, and can perform a machine vision task(s) based on the image(s) received from image processing system 204.

Additionally or alternatively, in some embodiments, computing device 210 can communicate data received from image data source 202 to a server 220 over a communication network 208, which can execute at least a portion of image processing system 204 and/or at least a portion of a machine vision system. In such embodiments, server 220 can return information to computing device 210 (and/or any other suitable computing device) indicative of an output of an image processing task performed by image processing system 204 and/or a computer vision task performed by a computer vision system. In some embodiments, image processing system 204 can execute one or more portions of process 600 described below in connection with FIG. 6.

In some embodiments, computing device 210 and/or server 220 can be any suitable computing device or combination of devices, such as a desktop computer, a laptop computer, a smartphone, a tablet computer, a wearable computer, a server computer, a computing device integrated into a vehicle (e.g., an autonomous vehicle), a camera, a robot, a virtual machine being executed by a physical computing device, etc.

In some embodiments, image data source 202 can be any suitable source of low bit depth image data (e.g., implemented with single-photon pixels, implemented with a combination of conventional pixels and single-photon pixels) and/or other data that can be used to generate high bit depth image data as described herein (e.g., depicting a scene in a physical environment of image data source 202). For example, image data source 202 can be implemented using one or more digital cameras that generate and/or output image data indicative of an arrival time of single photons. In a more particular example, image data source 202 can include an imaging device configured to detect arrival of individual photons (e.g., using avalanche photodiodes), such as imaging devices described in U.S. patent application Ser. No. 16/844,899, filed Apr. 9, 2020, and titled "Systems, methods, and media for high dynamic range quanta burst imaging." As another more particular example, image data source 202 can include an imaging device configured to detect arrival of individual photons (e.g., using jot-based detectors), such as imaging devices described in Fossum et al., "The quanta image sensor: Every photon Counts," Sensors, (2016).

In some embodiments, image data source 202 can be local to computing device 210. For example, image data source 202 can be incorporated with computing device 210 (e.g., computing device 210 can be configured as part of a device for capturing, storing, and/or processing image data). As another example, image data source 202 can be connected to computing device 210 by a cable, a direct wireless link, etc. Additionally or alternatively, in some embodiments, image data source 202 can be located locally and/or remotely from computing device 210, and can communicate image data (e.g., single-photon sensor image data, etc.) to computing device 210 (and/or server 220) via a communication network (e.g., communication network 208).

In some embodiments, communication network 208 can be any suitable communication network or combination of communication networks. For example, communication network 208 can include a Wi-Fi network (which can include one or more wireless routers, one or more switches, etc.), a peer-to-peer network (e.g., a Bluetooth network), a cellular network (e.g., a 3G network, a 4G network, a 5G network, etc., complying with any suitable standard, such as CDMA, GSM, LTE, LTE Advanced, NR, etc.), a wired network, etc. In some embodiments, communication network 208 can be a local area network, a wide area network, a public network (e.g., the Internet), a private or semi-private network (e.g., a corporate or university intranet), any other suitable type of network, or any suitable combination of networks. Communications links shown in FIG. 2 can each be any suitable communications link or combination of communications links, such as wired links, fiber optic links, Wi-Fi links, Bluetooth links, cellular links, etc.

Figure 3:
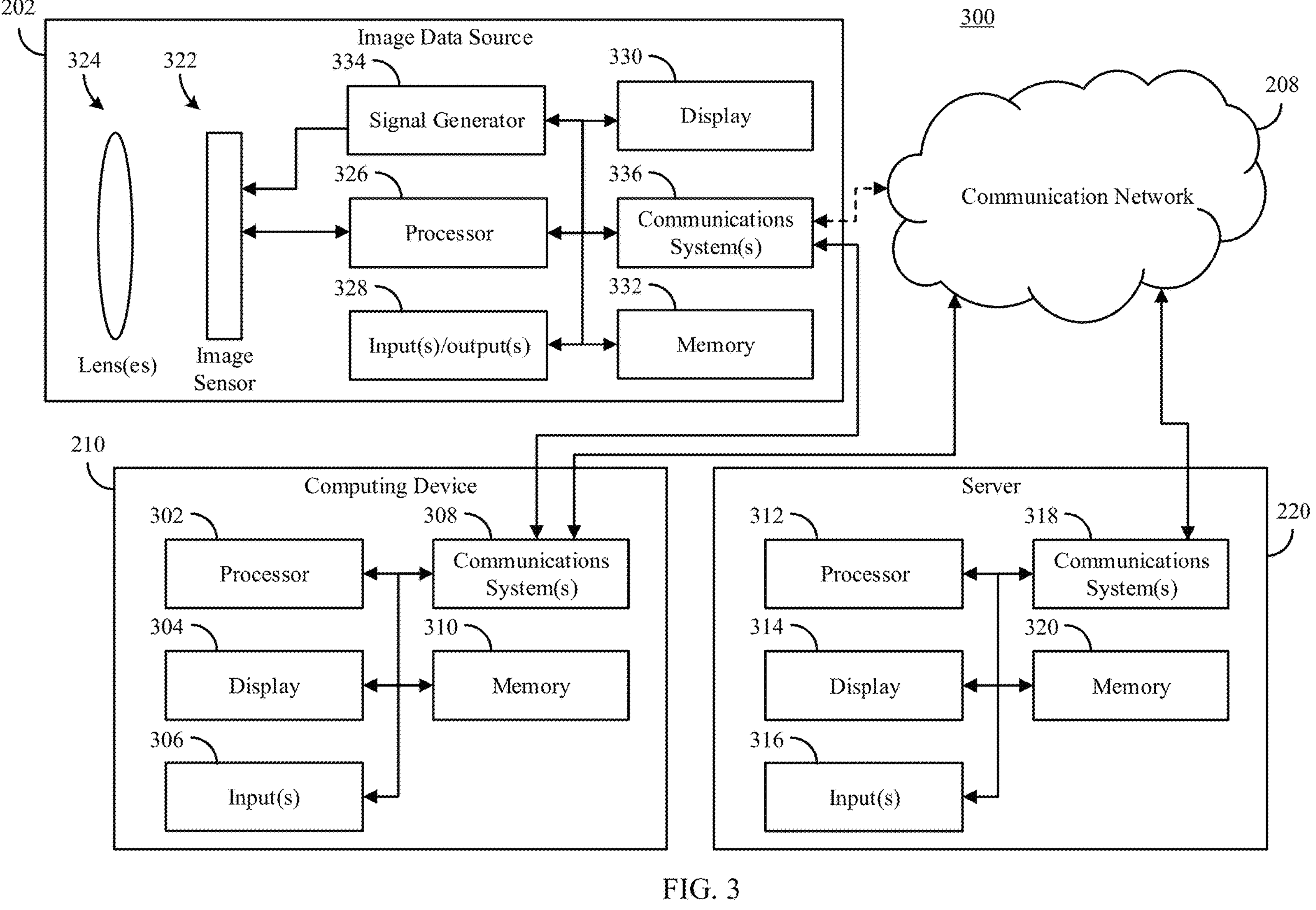
FIG. 3 shows an example of hardware that can be used to implement an image data source, a computing device, and a server, shown in FIG. 2 in accordance with some embodiments of the disclosed subject matter.

FIG. 3 shows an example of hardware that can be used to implement image data source 202, computing device 210, and/or server 220, shown in FIG. 2 in accordance with some embodiments of the disclosed subject matter. As shown in FIG. 3, in some embodiments, computing device 210 can include a processor 302, a display 304, one or more inputs 306, one or more communication systems 308, and/or memory 310. In some embodiments, processor 302 can be any suitable hardware processor or combination of processors, such as a central processing unit (CPU), a graphics processing unit (GPU), an application specific integrated circuit (ASIC), a field-programmable gate array (FPGA), a digital signal processor (DSP), a microcontroller (MCU), etc. In some embodiments, display 304 can include any suitable display devices, such as a computer monitor, a touchscreen, a television, an infotainment screen, etc. In some embodiments, inputs 306 can include any suitable input devices and/or sensors that can be used to receive user input, such as a keyboard, a mouse, a touchscreen, a microphone, etc.

In some embodiments, communications systems 308 can include any suitable hardware, firmware, and/or software for communicating information over communication network 208 and/or any other suitable communication networks. For example, communications systems 308 can include one or more transceivers, one or more communication chips and/or chip sets, etc. In a more particular example, communications systems 308 can include hardware, firmware and/or software that can be used to establish a Wi-Fi connection, a Bluetooth connection, a cellular connection, an Ethernet connection, etc.

In some embodiments, memory 310 can include any suitable storage device or devices that can be used to store image data, instructions, values, etc., that can be used, for example, by processor 302 to perform an image processing task, to perform a machine vision task, to present content using display 304, to communicate with server 220 via communications system(s) 208, etc. Memory 310 can include any suitable volatile memory, non-volatile memory, storage, or any suitable combination thereof. For example, memory 310 can include random access memory (RAM), read-only memory (ROM), electronically-erasable programmable read-only memory (EEPROM), one or more flash drives, one or more hard disks, one or more solid state drives, one or more optical drives, etc. In some embodiments, memory 310 can have encoded thereon a computer program for controlling operation of computing device 210. For example, in such embodiments, processor 302 can execute at least a portion of the computer program to perform one or more image processing tasks described herein and/or to perform one or more machine vision tasks based on an output generated by an image processing task described herein, present content (e.g., images, information about an object included in image data, information about distances to one or more points in a scene, etc.), receive information and/or content from image data source 202, transmit information to image data source 202, receive information and/or content from server 220, transmit information to server 220, etc. As another example, processor 302 can execute at least a portion of the computer program to implement image processing system 204 and/or a machine vision system. As yet another example, processor 302 can execute at least a portion of process 600 described below in connection with FIG. 6.

In some embodiments, server 220 can include a processor 312, a display 314, one or more inputs 316, one or more communications systems 318, and/or memory 320. In some embodiments, processor 312 can be any suitable hardware processor or combination of processors, such as a CPU, a GPU, an ASIC, an FPGA, a DSP, an MCU, etc. In some embodiments, display 314 can include any suitable display devices, such as a computer monitor, a touchscreen, a television, etc. In some embodiments, inputs 316 can include any suitable input devices and/or sensors that can be used to receive user input, such as a keyboard, a mouse, a touchscreen, a microphone, etc.

In some embodiments, communications systems 318 can include any suitable hardware, firmware, and/or software for communicating information over communication network 208 and/or any other suitable communication networks. For example, communications systems 318 can include one or more transceivers, one or more communication chips and/or chip sets, etc. In a more particular example, communications systems 318 can include hardware, firmware and/or software that can be used to establish a Wi-Fi connection, a Bluetooth connection, a cellular connection, an Ethernet connection, etc.

In some embodiments, memory 320 can include any suitable storage device or devices that can be used to store instructions, values, etc., that can be used, for example, by processor 312 to present content using display 314, to communicate with one or more computing devices 210, to communicate with one or more image data sources 202, etc. Memory 320 can include any suitable volatile memory, non-volatile memory, storage, or any suitable combination thereof. For example, memory 320 can include RAM, ROM, EEPROM, one or more flash drives, one or more hard disks, one or more solid state drives, one or more optical drives, etc. In some embodiments, memory 320 can have encoded thereon a server program for controlling operation of server 220. For example, in such embodiments, processor 312 can execute at least a portion of the server program to perform one or more image processing tasks described herein and/or to perform one or more machine vision tasks based on an output generate by an image processing task described herein, present content (e.g., images, information about an object included in image data, information about distances to one or more points in a scene, etc.), receive information and/or content from image data source 202, transmit information to image data source 202, receive information and/or content from computing device 210, transmit information to computing device 210, etc. As another example, processor 312 can execute at least a portion of the server program to implement image processing system 204 and/or a machine vision system. As yet another example, processor 312 can execute at least a portion of process 600 described below in connection with FIG. 6.

As shown, image data source 202 can include an image sensor 322 (e.g., an area sensor that includes an array of single photon detectors, such as a SPAD array or array of jots, e.g., as described in U.S. patent application Ser. No. 16/844,899); optics 324 (which can include, for example, one or more lenses, one or more attenuation elements such as a filter, a diaphragm, and/or any other suitable optical elements such as a beam splitter, etc.); a processor 326 for controlling operations of image data source 202 which can include any suitable hardware processor (which can be a CPU, a GPU, an FPGA, an ASIC, a DSP, an MCU, etc.) or combination of hardware processors; an input device(s) 328 (such as a shutter button, a menu button, a microphone, a touchscreen, a motion sensor, etc., or any suitable combination thereof) for accepting input from a user and/or from the environment; a display 330 (e.g., a touchscreen, a liquid crystal display, a light emitting diode display, etc.) to present information (e.g., images, user interfaces, etc.) for consumption by a user; memory 332; a signal generator 334 for generating one or more signals to control operation of image sensors 322; a communication system or systems 336 for facilitating communication between image data source 202 and other devices, such as a smartphone, a wearable computer, a tablet computer, a laptop computer, a personal computer, a server, an embedded computer (e.g., for controlling an autonomous vehicle, robot, etc.), etc., via a communication link. In some embodiments, memory 332 can store image data, and/or any other suitable data. Memory 332 can include a storage device (e.g., RAM, ROM, EEPROM, one or more flash drives, one or more hard disks, one or more solid state drives, one or more optical drives, etc.) for storing a computer program for controlling processor 326. In some embodiments, memory 332 can include instructions for causing processor 326 to execute processes associated with the mechanisms described herein, such as process 600 described below in connection with FIG. 6.

In some embodiments, image sensors 322 can be include an image sensor that is implemented at least in part using an array of SPAD detectors (sometimes referred to as a Geiger-mode avalanche diode) and/or one or more other detectors that are configured to detect the arrival time of individual photons (e.g., jots). In some embodiments, one or more elements of a single photon image sensor 322 can be configured to generate data indicative of the arrival time of photons from the scene via optics 324. For example, in some embodiments, image sensor 322 can be an array of multiple SPAD detectors. As yet another example, image sensor 322 can be a hybrid array including SPAD detectors and one or more conventional light detectors (e.g., CMOS-based pixels).

In some embodiments, image data source 202 can include additional optics. For example, although optics 324 is shown as a single lens, optics 324 can be implemented as compound lenses or combinations of lenses. Note that although mechanisms described herein are generally described as using SPAD-based detectors, this is merely an example of a single photon detector. As described above, other single photon detectors can be used, such as jot-based image sensors.

In some embodiments, signal generator 334 can be one or more signal generators that can generate signals to control image sensors 322. For example, in some embodiments, signal generator 334 can supply signals to enable and/or disable one or more pixels of image sensor 322 (e.g., by controlling a gating signal of a SPAD used to implement the pixel). As another example, signal generator 334 can supply signals to control readout of image signals from image sensor 322 (e.g., to memory 332, to processor 326, to a cache memory associated with image sensor 322, etc.).

In some embodiments, image data source 202 can communicate with a remote device over a network using communication system(s) 336 and a communication link. Additionally or alternatively, image data source 202 can be incorporated as part of another device and/or integrated as part of another device (e.g., computing device 210), such as a smartphone, a tablet computer, a laptop computer, an autonomous vehicle, a robot, etc. Parts of image data source 202 can be shared with a device within which image data source 202 is integrated. For example, if image data source 202 is integrated with an autonomous vehicle, processor 326 can be a processor of the autonomous vehicle and can be used to control operation of image data source 202.

In some embodiments, display 330 can be used to present images and/or video generated by image data source 202 and/or by another device (e.g., computing device 210, server 220, etc.), to present a user interface, etc. In some embodiments, display 330 can be implemented using any suitable device or combination of devices, and can include one or more inputs, such as a touchscreen.

Figure 4:
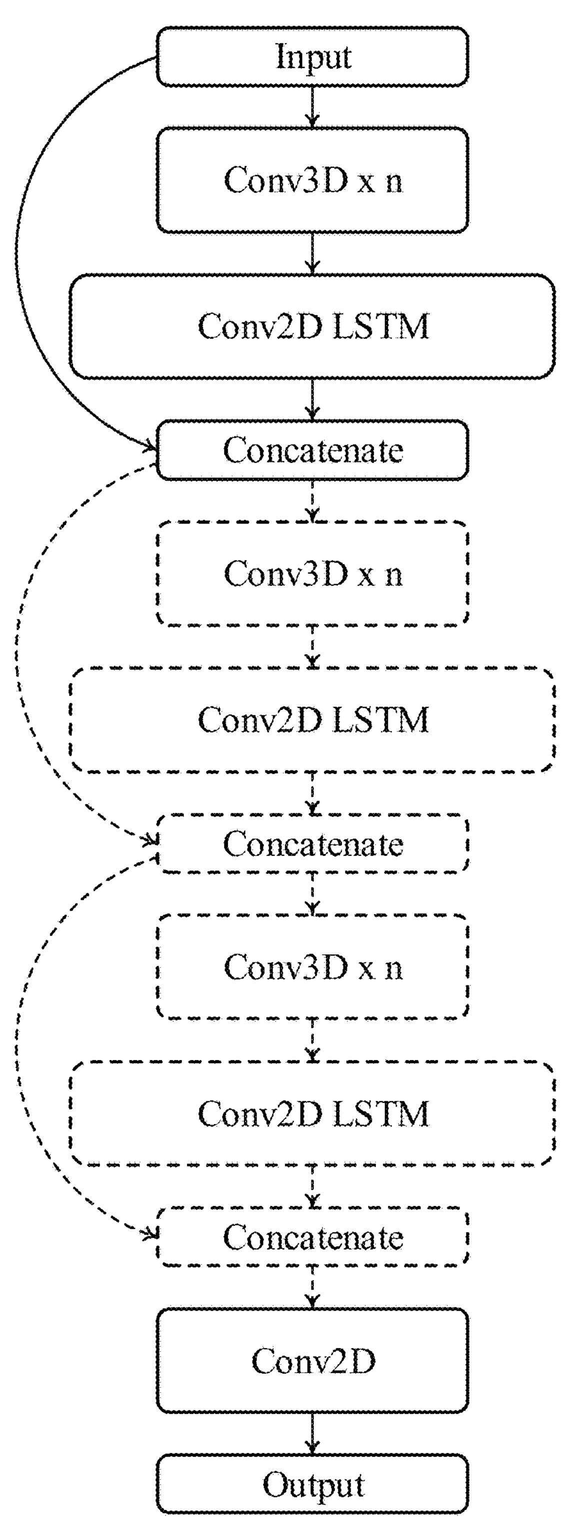
FIG. 4 shows an example of a topology of a convolutional neural network that can be used to implement mechanisms for generating digital images using low bit depth image sensor data in accordance with some embodiments of the disclosed subject matter.

FIG. 4 shows an example 400 of a topology of a machine learning model that can be used to implement mechanisms for generating digital images using low bit depth image sensor data in accordance with some embodiments of the disclosed subject matter. In some embodiments, a machine learning model based on topology 400 can receive input generated by a quanta image sensor (e.g., implemented with an array of SPADs). Such input can be formatted in various ways. For example, the input can be received as a sequence (e.g., a stream) of binary low bit depth frames (e.g., 1 bit frames). As another example, the input can be received as a sequence of non-binary low bit depth frames (e.g., a 2 bit frame, a 3 bit frame, etc.). In a more particular example, a multibit (e.g., 2 bit, 3 bit, 4 bit) frame include a value, at each pixel, corresponding to a sum of multiple binary frames. In such an example, a 2 bit frame can be a sum of up to four binary frames, a 3 bit frame can be a sum of up to eight binary frames, etc. As still another example, the input can be received as a sequence of averaged low bit depth frames. In such an example, data from each pixel location in a frame can be averaged across multiple frames (e.g., two frames, four frames, eight frames, or any other suitable number of frames). In a particular example, an average of eight frames can be calculated by, at each pixel location, determining a sum of pixel detections (e.g., for 1 bit frames, a value from 0 to 8), and dividing by 8. Note that multibit frames can include information from multiple binary frames, and an averaged low bit depth frame can be generated from one or more multibit frames. For example, data from four binary frames can be used to generate a 2 bit frame, and two 2 bit frames can be used to generate an average of eight frames by determining a sum of pixel values in the two frames, and dividing by 8.

In some embodiments, topology 400 can be utilize data from multiple color channels, and can output high bit depth color image data. For example, topology 400 can be modified to include multiple input channels (e.g., three image channels corresponding to red, green, and blue data, or more than three channels for color image data that includes more than three color channels) and multiple output channels (e.g., corresponding to colors associated with the input data).

In some embodiments, topology 400 can include one or more 3D convolutional layers. Such 3D convolutions can generate features that reflect spatiotemporal patterns in the input. For example, topology 400 can include a single 3D convolutional layer prior to a convolutional LSTM layer. As another example, topology 400 can include multiple 3D convolutional layers prior to a convolutional LSTM layer. In some embodiments, each 3D convolutional layer can use any suitable kernel. For example, a 3D convolutional layer can use a 3×3×3 kernel. As another example, a 3D convolutional layer can use a 1×1×1 kernel, a 5×5×5 kernel, a 7×7×7 kernel, or any other suitable kernel. In some embodiments, each 3D convolutional layer can include any suitable number of output channels, which can result in a corresponding number of kernels being trained. For example, each 3D convolutional layer can generate 128 output channels using 128 kernels. As another example, each 3D convolutional layer can generate more than 128 output channels (e.g., 256 output channels, 512 output channels, 1024 output channels, etc.). In some embodiments, each 3D convolutional layer can utilize any suitable activation function. For example, 3D convolutional layers can utilize a rectified linear unit (ReLU) activation with any suitable leak rate (e.g., a leak rate of 0.3, or any other suitable leak rate).

In some embodiments, one or more convolutional LSTM layer can be implemented using a unidirectional convolutional LSTM. Additionally or alternatively, one or more convolutional LSTM layers can be implemented using a bidirectional convolutional LSTM. For example, a unidirectional convolutional LSTM layer can utilize a single convolutional LSTM cell, which can sequentially receive as outputs of a 3D convolutional layer as inputs. As another example, a bidirectional convolutional LSTM layer can utilize multiple convolutional LSTM cells. In such an example, an LSTM cell can sequentially receive outputs of a 3D convolutional layer as inputs in an order in which the outputs are generated, and another LSTM cell can sequentially receive outputs a 3D convolutional layer as inputs in a reverse order to the order in which the outputs were generated.

In some embodiments, topology 400 can include one or more skip connections. For example, topology 400 can include a skip connection between an input and an output of an LSTM layer. In such an example, the input to the model and an output of the LSTM layer can be concatenated (e.g., via a concatenation layer) using any suitable technique or combination of techniques. In some embodiments, concatenation can be performed along the channel axis. For example, an input corresponding to a frame at time t can be concatenated with an output corresponding to a frame at time t. For example, if an input has 128 channels and an output has 128 channels, the concatenated output can have 256 channels. As another example, topology 400 can include a skip connection between an output of an LSTM layer and an output of a subsequent LSTM layer. In such an example, the input to the model, an output of the first LSTM layer, and an output of the subsequent LSTM layer can be concatenated (e.g., via a concatenation layer) using any suitable technique or combination of techniques. As yet another example, using skip connections and concatenation, a block l (e.g., including one or more 3D convolutional layers and a convolutional LSTM layer) can receive the input to block l−1, and also the input to all previous blocks (e.g., including the original model input).

In some embodiments, a model implemented in accordance with mechanisms described herein (e.g., using one or more bidirectional LSTM layers, using only unidirectional LSTM layers) can, when estimating $$\tilde{f}_i,$$

leverage information collected before frame $f_i$ (e.g., using frames with indices b≤i) and information collected after frame from $f_i$ (e.g., using frames with indices b≥i). For example, both bidirectional LSTMs and 3D convolutions (which can utilize receptive fields that extend a fixed distance into both the past and future in a stream of input frames) can leverage information from before and after a particular frame. As another example, in certain applications (e.g., real-time applications) where an output is generated before an entire input sequence is received as input, the convolutional LSTM can be implemented as a unidirectional LSTM and the 3D convolutions can lead to a fixed delay between receiving a frame $b_i$ and producing an estimate $$\tilde{f}_i.$$

In some embodiments, topology 400 can include at least one 2D convolutional layer that can generate an output frame. For example, a 2D convolutional layer can receive the output of a concatenation (e.g., including at least the output of a convolutional LSTM layer and the input data). In some embodiments, the 2D convolutional layer can use any suitable kernel. For example, the 2D convolutional layer can use a 1×1 kernel. The 2D convolutional layer can operate independently on output associated with each time step (e.g., output data associated with a particular input frame $b_i$). In some embodiments, the 2D convolutional layer can include any suitable number of output channels, which can correspond to an output frame (e.g., estimate $$\tilde{f}_i$$

). For example, the 2D convolutional layer can have a single output channel. In some embodiments, an output of the 2D convolutional layer can be in a particular range (e.g., 0 to 1). For example, outputs outside of a particular range can be clipped to the particular range (e.g., a value below zero can be set to zero, and a value above one can be set to one). As another example, an activation function (e.g., a sigmoid activation function) can be used to generate an output in a particular range. In some embodiments, an output of the 2D convolutional layer can be mapped to a high bit depth image (e.g., using any suitable tone mapping technique). For example, values can be converted to an integer value in a range including 0 and 255. In such an example, the mapping can be linear or non-linear.

In some embodiments, a model implemented in accordance with mechanisms described herein (e.g., based on topology 400, based on topology 500 described below in connection with FIG. 5, etc.) can be trained using any suitable technique or combination of techniques, and/or using any suitable training data. For example, the model can be trained using data that includes synthetic motion and/or data that includes video with real world motion. In a more particular example, some results described below were generated using a model trained using two datasets: a synthetic motion dataset and a real video dataset. Both datasets contained full-depth frames captured by conventional cameras, which were used as the ground truth during training. In some embodiments, frames used as input for training can be generated by applying random Poisson binarization to the full-depth frames.

In some embodiments, frames with synthetic motion can be generated using any suitable technique or combination of techniques. For example, a computing device (e.g., a computing device executing process 600) can extract a moving sequence of bounding boxes from a still image. The computing device can use random walks in each coordinate of the bounding box (e.g., x, y, rotation, and scale). Steps in the random walk can be computed using the relationship:

$$c_{s+1} = \text{clamp}\ (c_s + \Delta^c_{max} \cdot \mu(-1, 1), c_{min}, c_{max}) \tag{1}$$

where c is a coordinate (e.g., x coordinate, y coordinate, rotation, or scale), $$\Delta^c_{max}$$

is the maximum per-step change in c, $c_{min}$ and $c_{max}$ are bounds on c, and $\mu(-1, 1)$ is a sample from a uniform distribution between −1 and 1. One random walk step can correspond to several frames (e.g., 16 by default). Cubic spline interpolation can be used to smooth the piecewise linear walk between steps, resulting in C(1) smooth motion. The parameters $$\Delta^c_{max}, c_{min},$$

and $c_{max}$ for each coordinate can be tuned (e.g., manually) to achieve motion on the order of one pixel per frame.

In some embodiments, frames with real motion can be generated using any suitable technique or combination of techniques. For example, a computing device (e.g., a computing device executing process 600) can extract low bit depth frames from high bit depth video. For example, low bit depth frames were generated from real video from the Need for Speed (NFS) dataset, and were used during training of a model implemented in accordance with mechanisms described herein based on topology 500 described below in connection with FIG. 5. The NFS dataset includes 100 videos with 380,000 total frames captured at 240 frames per second (FPS). The frames a have resolution of 1280×720 pixels, which were downsized to 320×180 pixels to speed training and reduce the magnitude of inter-frame motion (measured in pixels per frame). Object bounding boxes associated with the videos were not used.

In some embodiments, a computing device (e.g., a computing device executing process 600) can generate a frame that simulates a frame captured by a low bit depth sensor from still image data and/or from a frame of video data using any suitable technique or combination of techniques. For example, the computing device can convert still image data or a frame of video to grayscale and reduce the bit width of the image (e.g., generating a binarized image). In a more particular example, the computing device can generate a binarized image using Poisson statistics. In such an example, a pixel with intensity $i \in [0, 1]$ can be binarizes using the relationship:

$$p = \begin{cases} 1 & \text{if } \mathcal{U}(0, 1) > e^{-i} \\ 0 & \text{else} \end{cases}. \tag{2}$$

where $\mathcal{U}(0, 1)$ is a sample from a uniform distribution between 0 and 1. Note that the intensity is not scaled prior to binarization. In some embodiments, multibit data can be generated by binarizing individual frames and summing or averaging multiple frames to generate a multibit frame.

In many real applications motion may be much less than one pixel per binary frame. Accordingly, it may often be computationally wasteful to perform reconstruction at a frame rate at which low bit depth frames (e.g., binary frames) are generated by an image sensor, which may be at a very high frame rate (e.g., 100,000 FPS or greater). In some embodiments, multiple frames (e.g., two frames, three frames, four frames, five frames, six frames, seven frames, eight frames, etc.) can be averaged, and the averaged frame can be provided as input to the model (e.g., for training and/or to a trained model). For example, inputs to the model can be averaged over 8-frame blocks. In such an example, the motion speed in the synthetic data can be scaled to give motion of approximately one pixel per 8-frame block. In the real video dataset, each frame can be repeated 8 times before binarization and 8-frame averaging. This 8-frame repetition makes the amount of motion between binary frames more manageable and can reduce the number of disk reads per sequence from 512 to 64.

Figure 5:
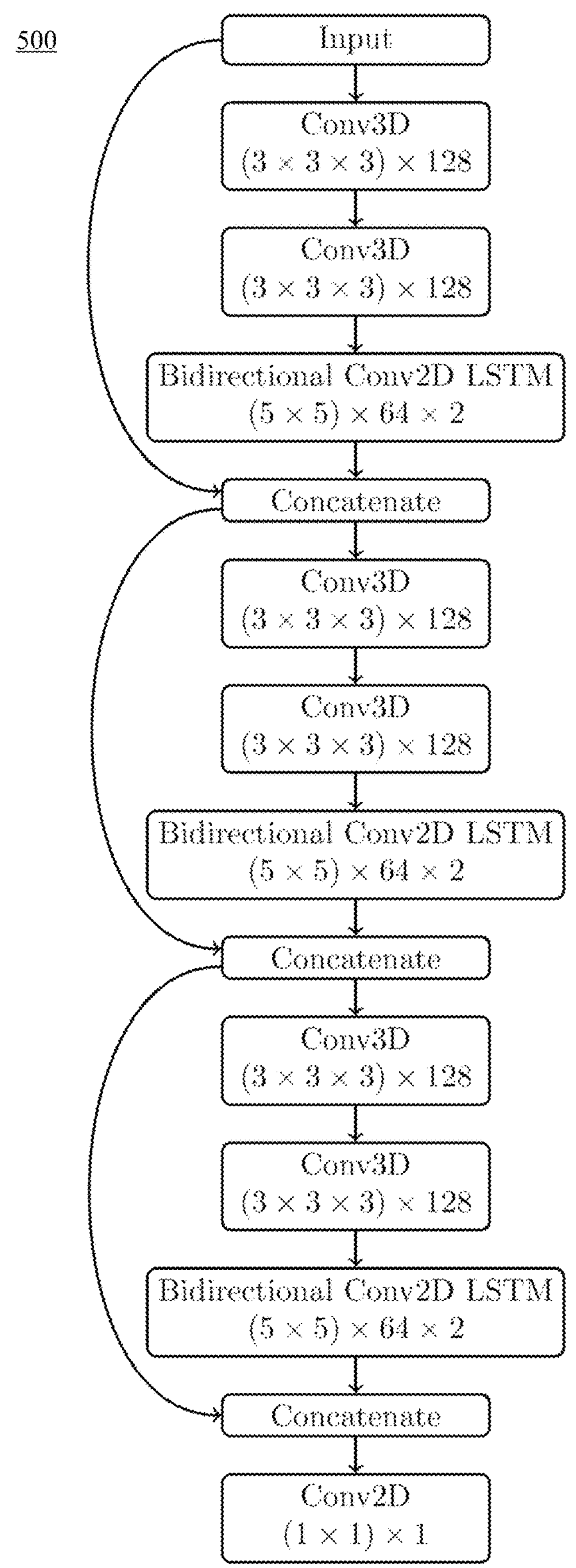
FIG. 5 shows an example of another topology of a convolutional neural network that can be used to implement mechanisms for generating digital images using low bit depth image sensor data in accordance with some embodiments of the disclosed subject matter.

FIG. 5 shows an example 500 of another topology of a convolutional neural network that can be used to implement mechanisms for generating digital images using low bit depth image sensor data in accordance with some embodiments of the disclosed subject matter. As shown in FIG. 5, topology 500 can include three blocks that each include two 3D convolutional layers and a bidirectional convolutional LSTM layer, and each block can be followed by a concatenation. The 3D convolutional layers can use 3×3×3 kernels, with 128 output channels, and the bidirectional convolutional LSTM layers can include two convolutional LSTM cells that can each use 5×5 kernels, and can each have 64 output channels. In some embodiments, topology 500 can include a 2D convolutional layer that can generate an output frame. The 2D convolutional layer can use a 1×1 kernel, with 1 output channel. In some embodiments, each 3D convolutional layer can utilize a rectified linear unit (ReLU) activation with a leak rate of 0.3.

In some embodiments, a machine learning model implemented in accordance with mechanisms described herein (e.g., using topography 400 and/or topography 500) can be trained using any suitable optimizer (e.g., the RMSProp optimizer), any suitable learning rate (e.g., a learning rate of $10^{-4}$), any suitable batch size (e.g., a batch size of 1), and any suitable loss function (e.g., an L2 loss function). In some embodiments, a training epoch can include any suitable number of sequences (e.g., 2048 sequences), each of which (after any averaging) can include any suitable number of input frames of any suitable size (e.g., 64 frames of size 32×32). In some embodiments, any suitable number of test sequences can be used to evaluate the performance of the trained machine learning model. For example, test sequences that include 64 frames of size 128×128 can be taken from a separate partition of the source dataset, and can be used to evaluate performance of the trained machine learning model.

Figure 6:
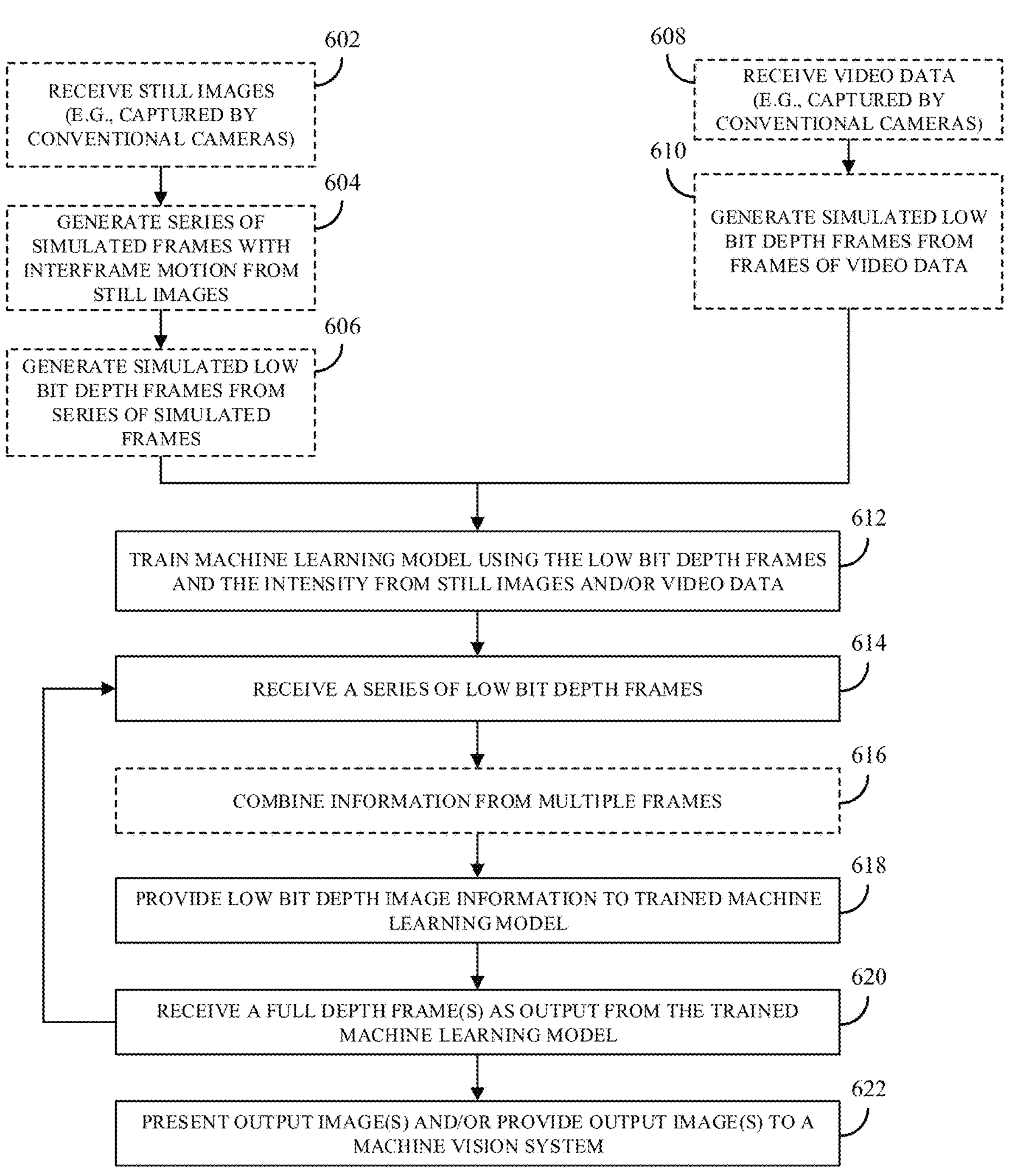
FIG. 6 shows an example of a process for generating digital images using low bit depth image sensor data in accordance with some embodiments of the disclosed subject matter.

FIG. 6 shows an example 600 of a process for generating digital images using low bit depth image sensor data in accordance with some embodiments of the disclosed subject matter.

At 602, process 600 can receive high bit depth still images (e.g., captured with a conventional image sensor, such as a CMOS image sensor, or a CCD image sensor). In some embodiments, process 600 can receive the high bit depth still images from any suitable source or combination of sources. For example, process 600 can receive the high bit depth images from a server (e.g., server 220), from a computing device (e.g., computing device 210), from memory (e.g., memory 310, memory 320), etc.

At 604, process 600 can generate a series of simulated frames with interframe motion (e.g., translation, rotation, simulate axial motion, etc.) from each of the still frames using any suitable technique or combination of techniques. For example, as described above in connection with EQ. (1), process 600 can determine a position, orientation, and/or scale of a bounding box, and can generate a simulated frame based on the position, orientation, and/or scale of a bounding box.

At 606, process 600 can generate simulated low bit depth frames from the series of simulated frames using any suitable technique or combination of techniques. For example, process 600 can generate a low bit depth image from each simulated frame using techniques described above in connection with EQ. (2). As another example, process 600 can generate multiple low bit depth image from each simulated frame. As described above in connection with FIG. 4, in some embodiments, process 600 can combine information from multiple simulated low bit depth frames, for example, by averaging a block of multiple frames.

In some embodiments, process 600 can omit 602 to 606. For example, process 600 can generate simulated low depth frames from video data, as described below in connection with 608 and 610.

At 608, process 600 can receive high bit depth video data (e.g., captured with a conventional image sensor, such as a CMOS image sensor, or a CCD image sensor). In some embodiments, process 600 can receive the high bit depth video data from any suitable source or combination of sources. For example, process 600 can receive the high bit depth images from a server (e.g., server 220), from a computing device (e.g., computing device 210), from memory (e.g., memory 310, memory 320), etc.

At 610, process 600 can generate simulated low bit depth frames from frames of the video data using any suitable technique or combination of techniques. For example, process 600 can generate a low bit depth image from each frame of video using techniques described above in connection with EQ. (2). As another example, process 600 can generate multiple low bit depth images from each frame of video. As described above in connection with FIG. 4, in some embodiments, process 600 can combine information from multiple simulated low bit depth frames, for example, by averaging a block of multiple frames.

At 612, process 600 can train a machine learning model (e.g., having a topology described above in connection with FIGS. 4 and/or 5) using low bit depth frames (e.g., generated at 606 and/or 610) and the intensity from corresponding still images and/or frames of video data. In some embodiments, process 600 can use any suitable technique or combination of techniques to train the machine learning model. For example, process 600 can use techniques described above in connection with FIGS. 4 and 5 to train the machine learning model. For example, as described above, in some embodiments, process 600 can use the L2 loss function, and can use an RMSProp optimizer.

At 614, process 600 can receive a series of low bit depth frames from any suitable source. For example, process 600 can receive SPAD image sensor data (e.g., 1 bit SPAD image sensor data, multibit SPAD image sensor data) of a scene. As another example, process 600 can receive jot image sensor data (e.g., 1 bit jot image sensor data, multibit jot image sensor data) of a same scene.

At 616, process 600 can combine information from multiple frames received at 614. For example, as described above in connection with FIG. 4, multiple frames (e.g., two frames, three frames, four frames, five frames, six frames, seven frames, eight frames, etc.) can be averaged, and the averaged frame can be provided as input to the trained machine learning model. In some embodiments, each frame can be included in a single average. For example, eight frames (e.g., frames 1 to 8) can be averaged to generate a first input, and another eight frames (e.g., frames 9 to 16) can be averaged to generate a second input. In some embodiments, combining information from multiple frames can be omitted. For example, if single low bit depth frames are provided as input to the trained machine learning model, combining information from multiple frames can be omitted.

At 618, process 600 can provide low bit depth image information as input to the trained machine learning model. In some embodiments, process 600 can provide a sequence of single low bit depth frames as input to the trained machine learning model. In some embodiments, process 600 can combine information from multiple low bit depth frames to generate an aggregated low bit depth frame, and provide a sequence of aggregated low bit depth frames as input to the trained machine learning model.

At 620, process 600 can receive a relatively high bit depth (e.g., a full depth) frame as output from the trained machine learning model. For example, as described above in connection with FIGS. 4 and 5, the trained machine learning model can generate a high bit depth frame for each input provided to the trained machine learning model (e.g., for each low bit depth frame provided as input to the trained machine learning model, for each aggregated low bit depth frame). In a more particular example, process 600 can receive the output in real time or near real time (e.g., generated by a trained machine learning model implemented with one or more unidirectional convolutional LSTM layers) after at least a predetermined number of inputs have been provided to the machine learning model. In such an example, the output can be generated after a delay corresponding to a number of frames in the trained machine learning model's receptive field. In such an example, using convolutions with 3×3×3 kernels, the receptive field can cover 1+2m frames, where m corresponds to the number of 3D convolutional layers used to implement the machine learning model. In a specific example, at a frame rate of about 100,000 frames per second, and using an average of 8 frames for each input frame, the delay can be on the order of about 1 millisecond (ms) for a machine learning model implemented using topology 500. In another more particular example, process 600 can receive the output in real time without a substantial delay (e.g., no delay after the initial frame is received at 614 and/or combined at 616) if temporal padding is applied prior to an input of a first frame. In yet another more particular example, process 600 can receive the output with a relatively short delay (e.g., generated by a trained machine learning model implemented with one or more bidirectional convolutional LSTM layers) after a predetermined number of inputs have been provided to the machine learning model. In such an example, the output can be generated after a delay corresponding to a number of frames in the processing window. In such an example, if input is processed in 128-frame blocks, the delay can correspond to the time taken to acquire the 128 frames. In a specific example, at a frame rate of about 100,000 frames per second, and using an average of 8 frames for each input frame, the delay can be on the order of about 10 ms.

In some embodiments, process 600 (or any other suitable process) can perform additional image processing on an output received at 620. For example, process 600 (or any other suitable process) can perform denoising to an output received at 620. As another example, process 600 (or any other suitable process) can perform deblurring to an output received at 620. In some embodiments, such image processing can be used in connection with an output of a machine learning model that is relatively light weight (e.g., having fewer layers, having fewer channels, etc.). For example, a machine learning model implemented using topology 500 can output relatively high quality images that may not benefit much (or at all) from further image processing. As another example, a machine learning model implemented using fewer layers, fewer channels, etc., may utilize fewer computing resources than a machine learning model implemented using topology 500, and may generate images that are relatively lower quality (e.g., which may benefit from use of additional image processing). In such an example, additional image processing may or may not be applied prior to utilizing an output of the trained machine learning model as input to a downstream task (e.g., for use in a machine vision task).

At 622, process 600 can present one or more output images (e.g., using a display), provide one or more output images to another device, provide one or more output images to a machine vision system (e.g., to perform a computer vision task). For example, process 600 can cause the one or more images to be presented via a display (e.g., display 330, display 304, display 314). As another example, process 600 can use the one or more images in a computer vision application (e.g., object detection and/or recognition).

Figure 7:
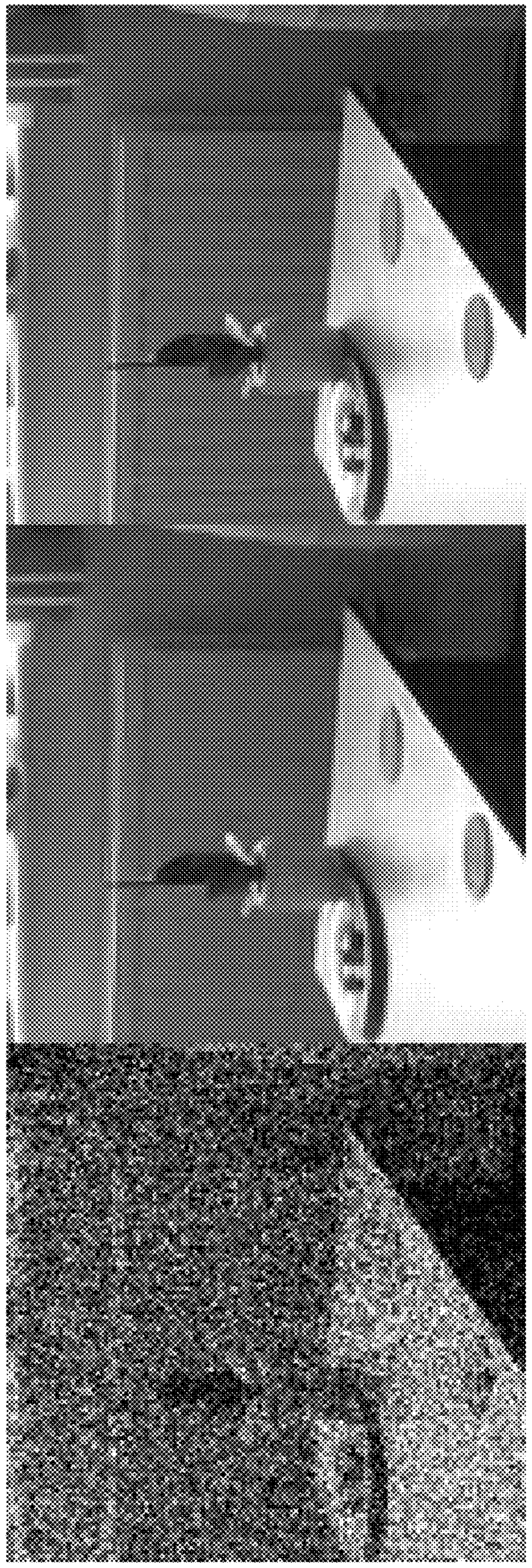
FIG. 7 shows an example of a low bit depth frame of a scene generated from a still image with simulated motion, a predicted low noise high bit depth frame of the scene generated from a stream of low bit depth frames using mechanisms described herein, and a ground truth image of the scene.

FIG. 7 shows an example of a low bit depth frame of a scene generated from a still image with simulated motion, a predicted low noise high bit depth frame of the scene generated from a stream of low bit depth frames using mechanisms described herein, and a ground truth image of the scene. Results shown in FIGS. 7 to 11 were generated using trained machine learning models implemented using the topology described above in connection with FIG. 5. The machine learning models were trained using the RMSProp optimizer, a learning rate of $10^{-4}$, a batch size of 1, and an L2 loss function. Each training epoch included 2048 sequences, each of which (after any averaging) included 64 frames of size 32×32. Test sequences included 64 frames of size 128×128 and are taken from a separate partition of the source dataset. A "core model" was trained for 100 epochs on a synthetic motion dataset with averaging over 8 binary frames. It achieved a peak signal to noise ratio (PSNR) of 32.10, and a structural similarity index (SSIM) of 0.8878. The predicted image in FIG. 7 was generated using the core model.

Figure 8:
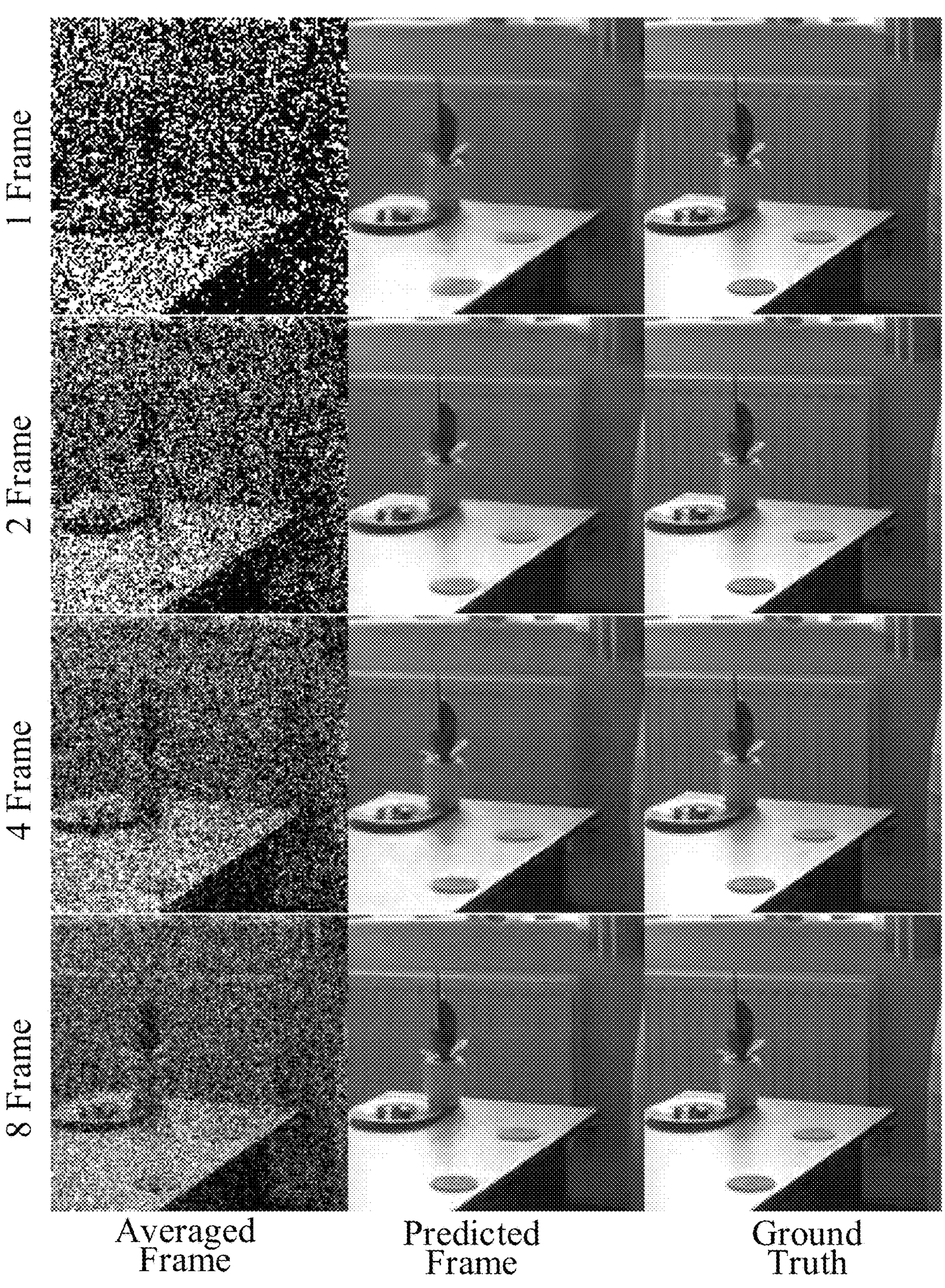
FIG. 8 shows examples of low bit depth frames based on varying numbers of binary frames generated from a still image with simulated motion, predicted low noise high bit depth frames of the scene generated from streams of the low bit depth frames using mechanisms described herein, and a ground truth image of the scene.

FIG. 8 shows examples of low bit depth frames based on varying numbers of binary frames generated from a still image with simulated motion, predicted low noise high bit depth frames of the scene generated from streams of the low bit depth frames using mechanisms described herein, and a ground truth image of the scene.

In some scenes, non-negligible motion may occur between each binary frame. As such, averaging may result in blurring and information loss. FIG. 8 shows a comparison of four models whose inputs are averaged over 1, 2, 4, and 8 binary frames. The motion speed between binary frames was scaled inversely by the number of averaged frames. In this way, the same amount of motion between averaged frames was achieved such that the behavior of the models can be analyzed as the signal-to-motion ratio decreases.

The four models were each trained from scratch for 50 epochs. The 1, 2, 4, and 8 frame models achieved PSNR of 27.95, 29.37, 30.11 and 31.68, respectively, and SSIM od 0.7448, 0.8090, 0.8305 and 0.8710, respectively. Performance generally decreases as the signal-to-motion ratio increases. However, models implemented and trained in accordance with mechanisms described herein performed quite well in the extreme case where motion is on the order of one pixel per binary frame.

Figure 9:
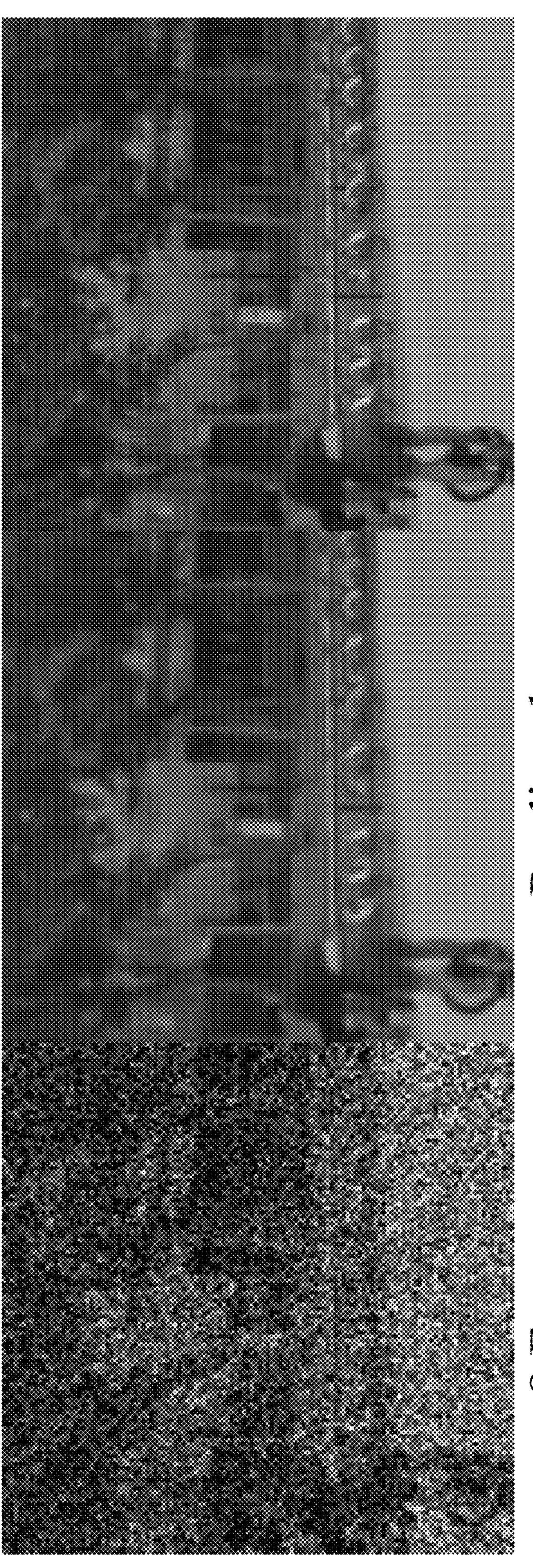
FIG. 9 shows an example of a low bit depth frame of a scene generated from video data, a predicted low noise high bit depth frame of the scene generated from a stream of low bit depth frames using mechanisms described herein, and a ground truth image of the scene.

FIG. 9 shows an example of a low bit depth frame of a scene generated from video data, a predicted low noise high bit depth frame of the scene generated from a stream of low bit depth frames using mechanisms described herein, and a ground truth image of the scene.

A machine learning model implemented in accordance with the topology described above in connection with FIG.

5 was initialized with the weights of the core model and trained for 50 epochs using training data generated from video. The model achieved PSNR of 34.90 and SSIM of 0.9238. Note that this is better than the performance of the synthetic motion model, likely due to the existence of large static regions in many real videos that facilitate high performance (e.g., based on the reduced amount of motion in the test data).

A baseline technique that included averaging all input frames together to attempt to generate a high bit depth image (e.g., averaging pixel values using 64 binary frames with no motion correction) was performed as a basis for comparison. This resulted in PSNR or 20.52 and SSIM of 0.6877 on the real video dataset. Another baseline technique that included performing a moving average over 64 binary frames (or 8 post-averaging frames). This resulted in PSNR of 20.83 and SSIM of 0.5868 on the real video dataset.

Figure 10:
FIG. 10 shows an example of a high bit depth frame of the scene generated from a set up binary frames using another technique, a predicted low noise high bit depth frame of the scene generated from a stream of low bit depth frames using mechanisms described herein, and a ground truth image of the scene.

FIG. 10 shows an example of a high bit depth frame of the scene generated from a set up binary frames using another technique, a predicted low noise high bit depth frame of the scene generated from a stream of low bit depth frames using mechanisms described herein, and a ground truth image of the scene.

Frames generated from real video data were used to generate a high bit depth image using a quanta burst photography (QBP) technique (e.g., described in U.S. Pat. No. 11,170,549). The results shown in FIG. 10 were generated using frames generated from real video data without repetition of the frames (unintentionally), resulting in eight times faster motion than was used in the training dataset used to train the model described above in connection with FIG. 9, and the "predicted image" in FIG. 10 was generated using the same model.

Both the QBP technique and the trained model of FIG. 9 were used to generate high bit depth images from 100 example sequences of low bit depth images. Since QBP recovers only a single frame from each sequence, the corresponding frame was extracted from the trained model's output for comparison. QBP and QBP-BM3D (a variant of QBP with a BM3D denoiser) achieved PSNR of 28.50 and 29.23 and SSIM of 0.7449 and 0.8160, respectively. The trained model yielded PSNR of 29.71 and SSIM of 0.8489. Although unintentional, the fact that the test motion speed was much higher than in the training dataset demonstrates the generalizability of mechanisms described herein to a variety of motion speeds.

Figure 11:
FIG. 11 shows an example of results of an object detection operation performed on a low bit depth frame of a scene generated from video data, a predicted low noise high bit depth frame of the scene generated from a stream of low bit depth frames using mechanisms described herein, and a ground truth image of the scene.

FIG. 11 shows an example of results of an object detection operation performed on a low bit depth frame of a scene generated from video data, a predicted low noise high bit depth frame of the scene generated from a stream of low bit depth frames using mechanisms described herein, and a ground truth image of the scene.

For many applications, high bit depth frames generated using mechanisms described herein can be used by a downstream processing application. For example, a user may wish to run an object detector or calculate optical flow and/or object recognition tasks. FIG. 11 shows results generated by running an off-the-shelf object detector (YOLOv3, e.g., described in Redmon et al., "YOLOv3: An incremental improvement," arXiv:1804.02767 (2018)) using an 8 frame average of binary frames generated from a frame of video, an output of the trained machine learning model described above in connection with FIG. 9, and the corresponding frame of video (labeled "ground truth"). As shown in FIG. 11, results of the object detection were similar when performed on the original video frame and the image output by the machine learning model, whereas an object was not detected in the 8 frame average.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as RAM, Flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, or any suitable media that is fleeting and devoid of any semblance of permanence during transmission, and/or any suitable intangible media.

It should be noted that, as used herein, the term mechanism can encompass hardware, software, firmware, or any suitable combination thereof.

It should be understood that the above described steps of the process of FIG. 6 can be executed or performed in any suitable order or sequence not limited to the order and sequence shown and described in the figures. Also, some of the above steps of the process of FIG. 6 can be executed or performed substantially simultaneously where appropriate or in parallel to reduce latency and processing times.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways.

What is claimed is:

1. A system for generating digital images having a bit depth higher than image frames sensed by an image sensor, the system comprising:

a communication system configured to receive image frames sensed by the image sensor;

at least one processor that is programmed to:

receive, via the communication system, a time series of image frames sensed by the image sensor for a given scene, wherein the time series of image frames comprises an image sensor bit depth;

provide data, based on the image sensor bit depth, from a plurality of image frames of the time series of image frames to a trained machine learning model, wherein the trained machine learning model has a topology structured to include: a feature analysis block trained to process spatiotemporal relationships among pixels across sets of input image frames, and an output block trained to generate estimated pixel intensity values based on learned patterns of the plurality of image frames, the estimated pixel intensity values having a bit depth higher than the image sensor bit depth; and generate an enhanced image of the given scene based on an output of the trained machine learning model, the enhanced image having the higher bit depth.

2. The system of claim 1, wherein the image sensor comprises a plurality of single-photon avalanche diodes.

3. The system of claim 1, wherein the plurality of image frames comprises a series of binary frames.

4. The system of claim 1, wherein pixels of the image sensor bit depth are represented using no more than 4 bits.

5. The system of claim 1, wherein pixels of the enhanced image of the given scene are represented using at least 8 bits.

6. The system of claim 1, wherein the trained machine learning model comprises a plurality of input channels, each corresponding to a color channel.

7. The system of claim 1, wherein the plurality of image frames comprises a first noise content, and the enhanced image of the given scene comprises a second noise content that is less than the first noise content.

8. The system of claim 7 wherein the plurality of image frames comprise a video of the scene, the first noise content comprises motion artifact, and wherein a plurality of enhanced images are generated based on the output of the trained machine learning model to comprise an enhanced video of the scene in which the motion artifact is removed.

9. A method for generating digital images having a bit depth higher than an image sensor bit depth sensed by an image sensor, the method comprising:

receiving, from a communication system, a series of image frames, wherein the series of image frames are output from the image sensor for a given scene and comprise data at the image sensor bit depth for a plurality of pixels;

providing data, based on the image sensor bit depth, from a plurality of image frames of the series of image frames to a trained machine learning model, wherein the trained machine learning model: processes spatiotemporal relationships among pixels across the plurality of image frames, and predicts pixel intensity values based on learned representations of the plurality of image frames; and generating an enhanced image of the given scene based on an output of the trained machine learning model, the enhanced image having the higher bit depth.

10. The method of claim 9, wherein the image sensor comprises a plurality of single-photon avalanche diodes.

11. The method of claim 9, wherein the series of image frames comprises a series of binary frames.

12. The method of claim 9, wherein pixels of the image sensor bit depth are represented using no more than 4 bits.

13. The method of claim 9, wherein pixels of the enhanced image of the given scene are represented using at least 8 bits.

14. The method of claim 9, wherein the trained machine learning model comprises a plurality of input channels, each corresponding to a color channel.

15. The method of claim 14, wherein the trained machine learning model comprises a topology structured to include: a feature analysis block trained to process spatiotemporal relationships among pixels across sets of input image frames, and an output block trained to generate estimated pixel intensity values based on learned patterns of the plurality of image frames, the estimated pixel intensity values having a bit depth higher than the image sensor bit depth.

16. The method of claim 15, wherein the trained machine learning model comprises:

a three-dimensional (3D) convolutional layer forming at least a part of the feature analysis block;

a two-dimensional (2D) convolutional long short term memory (LSTM) layer configured to receive an output of the 3D convolutional layer;

a concatenation layer configured to generate a tensor that includes a concatenation of an output of the 2D convolutional LSTM layer and image sensor bit depth image information; and a 2D convolutional layer forming at least a part of the output block; and configured to generate an output based on the tensor generated by the concatenation layer.

17. A non-transitory computer readable medium containing computer executable instructions that, when executed by a processor, cause the processor to perform a method for generating digital images, comprising:

receiving, from a communication system, a series of image frames, wherein the series of image frames are output from an image sensor for a given scene and comprise data at an image sensor bit depth for a plurality of pixels and a first noise content;

providing data, based on the image sensor bit depth, from a plurality of initial image frames of the series of image frames to a trained machine learning model, wherein the trained machine learning model identifies spatial and temporal patterns of pixels across the plurality of initial image frames, and learns statistical priors of the initial image frames to predict pixel intensity values; and generating a plurality of enhanced image frames of a scene based on an output of the trained machine learning model, wherein the plurality of enhanced image frames comprises a bit depth higher than the image sensor bit depth and a noise content lower than the first noise content.

18. The non-transitory computer readable medium of claim 17, wherein the image sensor comprises a plurality of single-photon avalanche diodes.

19. The non-transitory computer readable medium of claim 17, wherein the series of initial image frames comprises a series of binary frames.

20. The non-transitory computer readable medium of claim 17, wherein pixels of the image sensor bit depth are represented using no more than 4 bits, and pixels of the enhanced image frames are represented using at least 8 bits.

* * * * *